United States Patent [19]
Smith

[11] Patent Number: 6,120,285
[45] Date of Patent: *Sep. 19, 2000

[54] DIMPLED THERMAL PROCESSING FURNACE AND METHOD FOR PROCESSING SEMICONDUCTOR WAFERS

[75] Inventor: Keith W. Smith, Boise, Id.

[73] Assignee: Micron Technology, Inc., Boise, Id.

[*] Notice: This patent is subject to a terminal disclaimer.

[21] Appl. No.: 08/868,064

[22] Filed: Jun. 3, 1997

Related U.S. Application Data

[63] Continuation of application No. 08/559,592, Oct. 9, 1995, Pat. No. 5,645,417.

[51] Int. Cl.$^7$ ........................................... F27B 9/04
[52] U.S. Cl. .................... 432/152; 432/249; 118/715
[58] Field of Search ............... 432/5, 6, 11, 152, 432/241, 253, 249, 118; 118/724, 725, 715

[56] References Cited

U.S. PATENT DOCUMENTS

| | | | |
|---|---|---|---|
| 1,916,170 | 6/1933 | Hart | 432/118 |
| 4,136,965 | 1/1979 | Sunnergren et al. | 432/118 |
| 4,920,920 | 5/1990 | Shigeki | 118/725 |
| 4,992,044 | 2/1991 | Philipossian | 432/253 |
| 5,064,367 | 11/1991 | Philipossian | 432/253 |
| 5,206,880 | 4/1993 | Olsson | 373/111 |
| 5,248,253 | 9/1993 | Philipossian et al. | 432/6 |
| 5,458,191 | 10/1995 | Chiang et al. | 165/133 |
| 5,571,333 | 11/1996 | Kanaya | 118/724 |

*Primary Examiner*—Denise L. Ferensic
*Assistant Examiner*—Jiping Lu
*Attorney, Agent, or Firm*—Ormiston, Korfanta & Holland, PLLC

[57] ABSTRACT

A tube for use in a thermal processing furnace. The tube comprises an elongated cylindrical tube having an inner surface with a plurality of dimples disposed thereon. In one preferred version of the invention, the dimples are formed as an integral part of the inner surface of the cylindrical tube. In another aspect of the invention, the dimpled furnace tube is incorporated into a thermal processing furnace. In this aspect of the invention, the furnace includes a furnace tube having an inner surface describing an elongated cylindrical heated chamber for receiving and processing a plurality of axially aligned spaced apart semiconductor wafers. The inner surface has a plurality of dimples disposed thereon. The furnace further includes an inlet for introducing reactant and/or inert gases into one end of the cylindrical chamber to flow axially within the chamber by the wafers and an outlet for removing the gases from the cylindrical chamber.

8 Claims, 3 Drawing Sheets

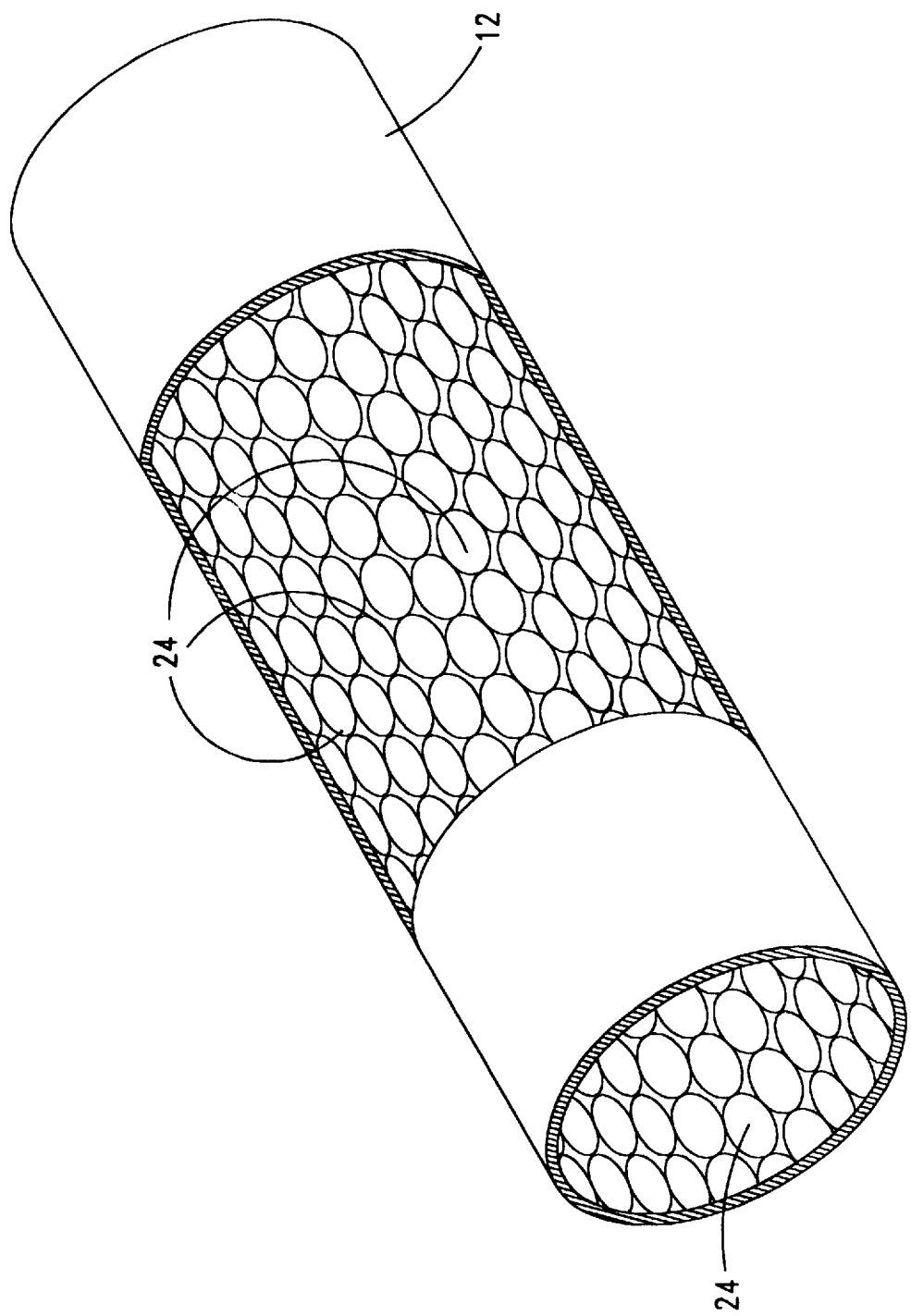

DIMPLED THERMAL PROCESSING FURNACE AND METHOD FOR PROCESSING SEMICONDUCTOR WAFERS

This application is a continuation of application Ser. No. 08/559,592, filed Oct. 9, 1995, now 5,645,417.

FIELD OF THE INVENTION

The invention relates generally to semiconductor processing equipment and, more particularly, to a thermal processing furnace tube.

BACKGROUND OF THE INVENTION

Semiconductor devices are constructed of patterned layers of electrically conductive, non-conductive and semi-conductive materials stacked over a silicon wafer. The layers of material are successively deposited on the wafer and etched into predefined patterns to form individual component structures within the particular device being fabricated. The manufacturing process typically also includes the heat treatment of the silicon wafers at different stages of manufacture in a thermal processing furnace, sometimes referred to as a "diffusion" furnace. Diffusion furnaces are used for heat treatment processes such as impurity diffusion, oxide growth, chemical vapor deposition ("CVD"), annealing and the like. The furnaces basically include a furnace tube surrounded by a heating element. The wafers are placed in the furnace tube in specially made cassettes or "boats" wherein the wafers are arranged parallel to one another and oriented so that the surface of each wafer is perpendicular to the longitudinal axis of the furnace tube. The diameter of the furnace tube is somewhat greater than the diameter of the wafers.

During processing, the wafers are heated to the desired temperature and inert and reactant gases are introduced into the furnace tube. Gases introduced into one end of the furnace tube thus flow over the wafers axially along the length of the furnace tube and are exhausted at the other end. A region of laminar flow exists between transition areas formed by velocity gradients in the gases flowing axially along the inner surface of the tube and along the edges of the wafers. A region of turbulent flow exists fully across the surfaces of the wafers. This turbulent region and the corresponding pressure drop promotes a more uniform reaction between the gases and the surface materials of the wafers. The present invention is directed to an improved furnace tube wherein the transition area formed along the inner surface of the tube is extended outward to narrow the laminar region of the flow of gases through the tube. Narrowing the laminar region of flow causes higher turbulence in the turbulent region, which increases the pressure drop across the surface of the wafers, and results in a more uniform reaction across the surface of the wafers.

SUMMARY OF THE INVENTION

Accordingly, it is one object of the invention to enhance the uniformity of the reaction between the gases introduced into the furnace tube and the surface materials of the wafers. It is another object to extend the transition area formed along the inner surface of the furnace tube outward to narrow the laminar region of the flow of gases through the tube and thereby increase the pressure drop across the surface of the wafers to promote a more uniform reaction across the surface of the wafers.

These and other objects are achieved by a furnace tube that includes an elongated cylindrical tube having an inner surface with a plurality of dimples disposed thereon. In one preferred version of the invention, the dimples are formed as an integral part of the inner surface of the cylindrical tube. In another aspect of the invention, the dimpled furnace tube is incorporated into a thermal processing furnace. In this aspect of the invention, the furnace includes a furnace tube having an inner surface describing an elongated cylindrical heated chamber for receiving and processing a plurality of axially aligned spaced apart semiconductor wafers. The inner surface has a plurality of dimples disposed thereon. The furnace further includes an inlet for introducing reactant and/or inert gases into one end of the cylindrical chamber to flow axially within the chamber by the wafers and an outlet for removing the gases from the cylindrical chamber.

BRIEF DESCRIPTION OF THE DRAWINGS

FIG. 3 is a cut-away perspective view of a thermal furnace processing tube showing the dimpled inner surface.

DETAILED DESCRIPTION OF THE INVENTION

Figure 1:
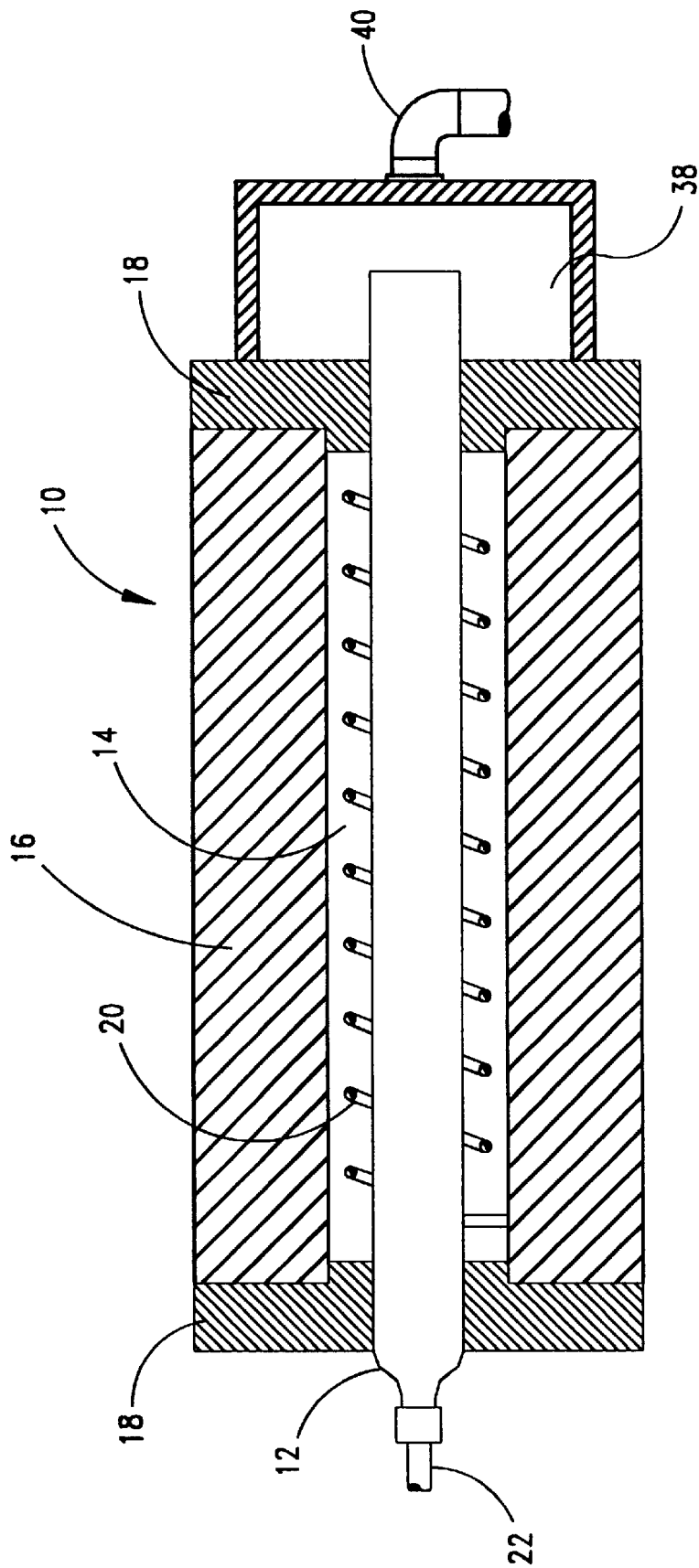
FIG. 1 cross section side view of a thermal processing furnace.
Figure 2:
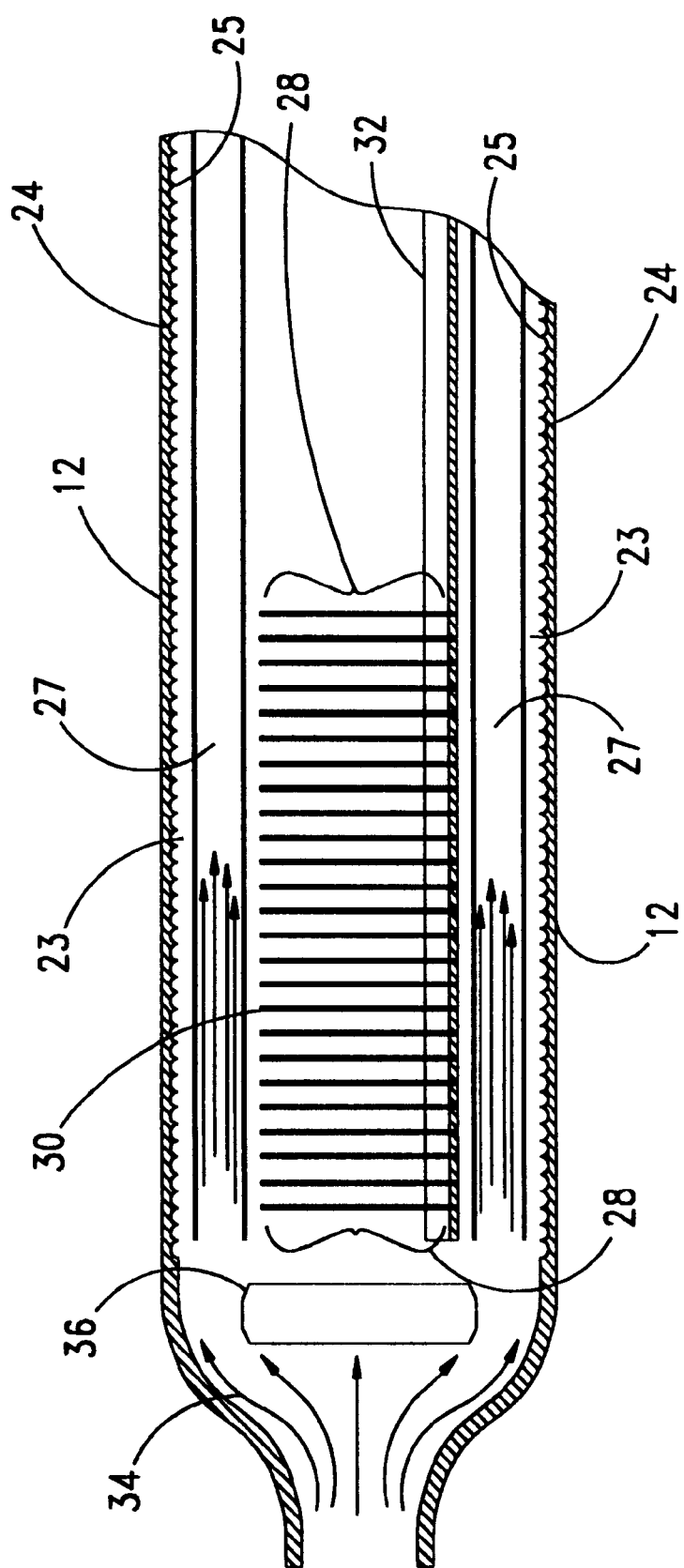
FIG. 2 is a cross section side view of a thermal furnace processing tube having a dimpled inner surface.

Referring to FIGS. 1–3, a furnace 10 for thermal processing of semiconductor wafers is illustrated according to the preferred embodiment of the invention. An elongated cylindrical furnace tube 12 is located inside a cylindrical opening 14 in the walls 16 of furnace 10. Support collars 18 support furnace tube 12 and serve as a gasket or packing gland to seal opening 14. Furnace 10 includes resistance type heater element 20 which is used to raise the temperature within the furnace tube 12 for performing certain steps in the semiconductor manufacturing process, such as diffusion, CVD, oxide growth or the like. Walls 16, collars 18 and furnace tube 12 are typically made of a ceramic or refractory material such as quartz or silicon carbide. A source of reactant and/or inert gas is connected to an inlet 22 at one end of furnace tube 12 to provide the desired atmosphere within tube at various times in the operating cycle. Since the apparatus is intended to accommodate 8 inch wafers, furnace tube 12 has a diameter of about 12 inches, although the particular size is selected according to the intended use of the furnace. Furnace 10, as just described, is intended to represent any conventional tubular diffusion furnace commonly used in semiconductor manufacturing. The construction and operation of such furnaces are well known to those skilled in the art.

Dimples 24 are formed on inner surface 25 of furnace tube 12, as shown in FIGS. 2 and 3. Dimples 24 extend the transition area 23 formed along inner surface 25 of tube 12 outward to narrow the laminar region 27 of the flow of gases through tube 12. Narrowing the laminar region 27 of flow causes higher turbulence in the turbulent region 28, which increases the pressure drop across the surface of the wafers 30, and results in a more uniform reaction across the surface of the wafers. Dimples 24 are preferably formed as an integral part of inner surface 25 of furnace tube 12. Dimples 24, as used herein, represent generally any topographic feature disposed on inner surface 25 of tube 12 to extend transition area 23. For example, a variety of projections, bumps and/or indentations could be used. The preferred size, shape and spacing of dimples 24 may be varied to achieve the desired flow regions within tube 12 depending on the processing temperatures, types of gases used, total gas flow and wafer spacing.

Wafers 30, which are typically carried in a cassette or "boat", are placed on paddle 32 and inserted into furnace tube 12. As is well known to those skilled in the art, a variety of different conventional wafer loading devices may be used to insert the wafers into and remove them from furnace tube. The type of insertion mechanism used is not important to the invention, except to the extent a covered insertion tube is used such as that described in U.S. Pat. Nos. 4,526,534 and 5,256,060, issued to Wollmann and Philipossian et al., respectively. Where a covered inner tube such as that disclosed in the Wollmann and Philipossian patents is used, the inner surface of the inner tube should be dimpled as described above to achieve the enhanced flow across the surface of the wafers. Then, wafers 30 are elevated to the desired temperature and reactant gases are introduced into furnace tube 12. The gas flows over wafers 30, as indicated by arrows 34 in FIG. 2, for the desired time after which the reactant gases are exhausted from furnace tube 12 and replaced with an inert gas. The wafers 30 are then removed from furnace tube 12 for further processing. Baffles 36 are typically used to retard heat loss and to help ensure adequate reactant gas mixing without unduly restricting the flow of gas through furnace tube 12. Many different baffle arrangements are known and can be substituted for the one shown. The spent or exhaust gases are typically collected in a scavenger box for delivery to a "scrubber" or other suitable waste disposal or recycling system (not shown) through outlet 40.

There has been shown and described a novel thermal processing furnace tube which has a dimpled inner surface to create a more uniform reaction across the surface of the wafers. The particular embodiments shown in the drawings and described herein are for purposes of example and should not be construed to limit the invention as set forth in the appended claims.

What is claimed is:

1. A furnace for processing semiconductor wafers, comprising:

a furnace tube having an inner surface describing an elongated cylindrical chamber configured to receive the wafers;

a heating element operatively coupled to the furnace tube;

means for establishing gas flow through the chamber, the gas flow including a region of turbulent gas flow around the wafers, a region of laminar gas flow between the inner surface and the region of turbulent flow, and a transition area defined by the area between the inner surface and the region of laminar gas flow; and means along the inner surface of the furnace tube for narrowing the region of laminar flow.

2. A furnace according to claim 1, wherein the means for narrowing comprises a plurality of dimples disposed on the inner surface of the furnace tube.

3. A furnace according to claim 1, wherein the means for establishing comprises an inlet through which gases may be introduced into the chamber and an outlet through which gases may be removed from the chamber.

4. A method for processing semiconductor wafers in a thermal processing furnace of the type that includes a heated furnace tube having an inner surface describing an elongated cylindrical chamber through which gas flows for receiving and processing semiconductor wafers, the method comprising the steps of:

defining a region of turbulent gas flow around the wafers;

defining a region of laminar gas flow between the inner surface and the region of turbulent flow;

defining a transition area as the area between the inner surface and the region of laminar flow; and narrowing the region of laminar flow.

5. A method according to claim 4, wherein the step of narrowing the laminar region comprises extending the transition area out from the inner surface of the furnace.

6. A method according to claim 4, wherein the step of narrowing the laminar region comprises forming dimples on the inner surface of the furnace.

7. A method according to claim 5, wherein the step of extending the transition area comprises forming dimples on the inner surface of the furnace.

8. A method for processing semiconductor wafers in a thermal processing furnace of the type that includes a heated furnace tube having an inner surface describing an elongated cylindrical chamber for receiving and processing axially aligned spaced apart semiconductor wafers, the method comprising the steps of:

forming dimples on the inner surface of the furnace;

introducing a gas into the chamber;

causing the gas to flow axially past the wafers; and removing gas from the chamber.

* * * * *